(12) United States Patent
Noh et al.

(10) Patent No.: US 11,133,383 B2
(45) Date of Patent: Sep. 28, 2021

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Chang Woo Noh, Hwaseong-si (KR); Dong Il Bae, Seongnam-si (KR); Geum Jong Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/741,868

(22) Filed: Jan. 14, 2020

(65) Prior Publication Data

US 2020/0411641 A1 Dec. 31, 2020

(30) Foreign Application Priority Data

Jun. 26, 2019 (KR) ........................ 10-2019-0076005

(51) Int. Cl.
| | |
|---|---|
| *H01L 29/06* | (2006.01) |
| *H01L 21/02* | (2006.01) |
| *H01L 21/311* | (2006.01) |
| *H01L 21/84* | (2006.01) |
| *H01L 27/12* | (2006.01) |
| *H01L 29/08* | (2006.01) |
| *H01L 29/10* | (2006.01) |
| *H01L 29/165* | (2006.01) |
| *H01L 29/423* | (2006.01) |
| *H01L 29/66* | (2006.01) |

(52) U.S. Cl.
CPC .... *H01L 29/0673* (2013.01); *H01L 21/02532* (2013.01); *H01L 21/31111* (2013.01); *H01L 21/845* (2013.01); *H01L 27/1211* (2013.01); *H01L 29/0847* (2013.01); *H01L 29/1037* (2013.01); *H01L 29/165* (2013.01); *H01L 29/42392* (2013.01); *H01L 29/6653* (2013.01); *H01L 29/66553* (2013.01); *H01L 29/66636* (2013.01)

(58) Field of Classification Search
CPC .......... H01L 29/0673; H01L 29/42392; H01L 21/31111; H01L 21/845; H01L 27/1211; H01L 29/0669; H01L 29/0847; H01L 29/1037; H01L 29/66439; H01L 29/6653; H01L 29/66553; H01L 29/66636; H01L 29/775

See application file for complete search history.

(56) References Cited

U.S. PATENT DOCUMENTS

| | | | |
|---|---|---|---|
| 7,427,788 B2 | 9/2008 | Li et al. | |
| 9,570,609 B2 | 2/2017 | Obradovic et al. | |
| 9,620,590 B1 | 4/2017 | Bergendahl et al. | |

(Continued)

FOREIGN PATENT DOCUMENTS

KR 10-2010-0028910 A 3/2010

*Primary Examiner* — David C Spalla
(74) *Attorney, Agent, or Firm* — Lee IP Law, P.C.

(57) ABSTRACT

A semiconductor device including a buried insulating layer on a substrate; a lower semiconductor layer on the buried insulating layer, the lower semiconductor layer including a first material; a channel pattern on the lower semiconductor layer, the channel pattern being spaced apart from the lower semiconductor layer and including a second material different from the first material; and a gate electrode surrounding at least a portion of the channel pattern.

16 Claims, 14 Drawing Sheets

(56) References Cited

U.S. PATENT DOCUMENTS

| | | |
|---|---|---|
| 9,653,287 B2 | 5/2017 | Rodder et al. |
| 9,881,998 B1 | 1/2018 | Cheng et al. |
| 9,997,618 B2 | 6/2018 | Cheng et al. |
| 10,008,603 B2 | 6/2018 | Wei et al. |
| 2017/0040321 A1* | 2/2017 | Mitard .............. H01L 29/78696 |
| 2019/0164965 A1* | 5/2019 | Chen ................... H01L 29/0676 |
| 2020/0098756 A1* | 3/2020 | Lilak ................. H01L 29/66545 |
| 2020/0168742 A1* | 5/2020 | Wang ................ H01L 29/42392 |

* cited by examiner

SEMICONDUCTOR DEVICE AND METHOD FOR FABRICATING THE SAME

CROSS-REFERENCE TO RELATED APPLICATION

Korean Patent Application No. 10-2019-0076005 filed on Jun. 26, 2019, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

As a scaling technique for increasing the density of semiconductor devices, a multi-gate transistor, in which a fin or nanowire-shaped silicon body is formed on a substrate and a gate is formed on the surface of the silicon body, may be considered.

The multi-gate transistor may use a three-dimensional (3D) channel, and scaling of the multi-gate transistor may be facilitated. Current control capability may be improved without increasing the gate length of the multi-gate transistor. In addition, a short channel effect (SCE), in which the potential of a channel region is affected by a drain voltage, may be effectively suppressed.

SUMMARY

The embodiments may be realized by providing a semiconductor device including a buried insulating layer on a substrate; a lower semiconductor layer on the buried insulating layer, the lower semiconductor layer including a first material; a channel pattern on the lower semiconductor layer, the channel pattern being spaced apart from the lower semiconductor layer and including a second material different from the first material; and a gate electrode surrounding at least a portion of the channel pattern.

The embodiments may be realized by providing a semiconductor device including a lower semiconductor layer on a substrate, the lower semiconductor layer including a first material; a stacked structure on the lower semiconductor layer, the stacked structure including a conductive pattern and an upper semiconductor layer on the conductive pattern, and the upper semiconductor layer including a second material different from the first material; and a source/drain region on the lower semiconductor layer, the source/drain region being connected to the upper semiconductor layer.

The embodiments may be realized by providing a semiconductor device including a silicon substrate; a buried insulating layer on the silicon substrate, the buried insulating layer including an oxide; a lower semiconductor layer on the buried insulating layer, the lower semiconductor layer including a recess; a first silicon channel pattern spaced apart from the lower semiconductor layer; a second silicon channel pattern on the first silicon channel pattern; a gate electrode on the lower semiconductor layer, the gate electrode surrounding at least a portion of the first silicon channel pattern and the second silicon channel pattern; and a source/drain region connected to the first silicon channel pattern and the second silicon channel pattern and filling at least a portion of the recess, wherein the lower semiconductor layer includes a material different from materials of the first silicon channel pattern and the second silicon channel pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
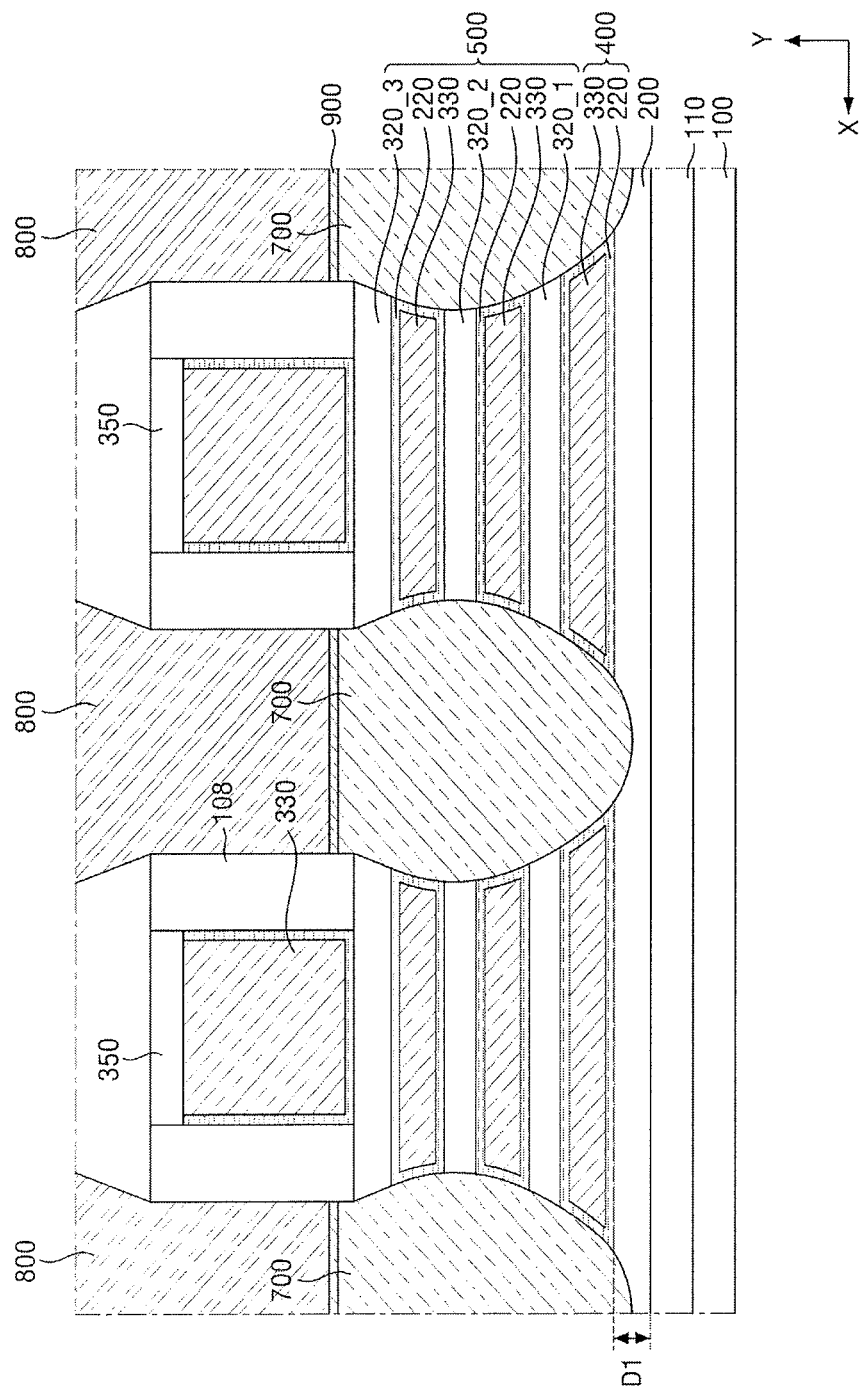
FIG. 1 illustrates a schematic sectional view of a semiconductor device according to some embodiments.

FIG. 1 illustrates a schematic sectional view of a semiconductor device according to some embodiments.

Referring to FIG. 1, a semiconductor device according to some embodiments may include a substrate 100, a buried insulating layer 110 on the substrate 100, a lower semiconductor layer 200 on the buried insulating layer 110, and a conductive pattern 400, a first channel pattern 320_1, a second channel pattern 320_2, a third channel pattern 320_3, a gate spacer 108, a capping pattern 350, and a plurality of contacts 800 on the lower semiconductor layer 200. The conductive pattern 400 may include a gate electrode 330 and a gate insulating layer 220. In an implementation, as illustrated in FIG. 1, three of the plurality of channel patterns 320_1, 320_2 and 320_3 and three of the plurality of conductive patterns 400 may be included (e.g., stacked in a thickness direction of the substrate 100). In an implementation, the first channel pattern 320_1, the second channel pattern 320_2 and the third channel pattern 320_3 may be collectively referred to as the plurality of channel patterns 320_1, 320_2 and 320_3.

The substrate 100 may be, e.g., a silicon substrate, or may include other materials such as silicon germanium, indium antimonide, lead tellurium compound, indium arsenide, indium phosphide, gallium arsenide, or gallium antimonide. As used herein, the term "or" is not an exclusive term, e.g., "A or B" would include A, B, or A and B. In an implementation, the substrate 100 may have an epitaxial layer formed on a base substrate.

In an implementation, the buried insulating layer 110 may include, e.g., silicon oxide, silicon oxynitride, silicon nitride, or a combination thereof. For simplicity of description, a case where the buried insulating layer 110 is made of silicon oxide will be described as an example.

For example, the substrate 100 and the buried insulating layer 110 on the substrate 100 may be silicon-on-insulator (SOI). In an implementation, the buried insulating layer 110 may be a buried oxide (BOX) layer of or on the SOI substrate 100.

The lower semiconductor layer 200 may be on the buried insulating layer 110. The lower semiconductor layer 200 may be formed of or include, e.g., silicon germanium (SiGe). In a process of fabricating a semiconductor device according to some embodiments, the thickness of the silicon germanium may be increased to help reduce the possibility of or prevent an unetch phenomenon from occurring when forming a source/drain recess. The silicon germanium may be the same as a material of sacrificial layers formed during the semiconductor fabricating process, and the silicon germanium constituting the lower semiconductor layer 200 may also be partially removed when the sacrificial layers are removed. For example, according to a method of fabricating a semiconductor device, the thickness of the lower semiconductor layer 200 remaining in the semiconductor device after fabrication may be thin, thereby preventing deterioration of a leakage current of a semiconductor device according to some embodiments, and also reducing a leakage capacitance.

The conductive pattern 400 may be on the lower semiconductor layer 200. The conductive pattern 400 may include the gate electrode 330. In an implementation, the gate electrode 330 may include, e.g., TiN, WN, TaN, Ru, TiC, TaC, Ti, Ag, Al, TiAl, TiAlN, TiAlC, TaCN, TaSiN, Mn, Zr, W, or Al. In an implementation, the gate electrode 330 may be formed of or include, e.g., Si, SiGe, or the like, rather than metal. In an implementation, the gate electrode 330 may be formed, e.g., by a replacement process.

The conductive pattern 400 may also include the gate insulating layer 220 surrounding the gate electrode 330. In an implementation, the gate insulating layer 220 may have, e.g., a shape surrounding every surface except for the upper surface of an uppermost gate electrode 330 (e.g., except for a surface facing away from the substrate 100 of a gate electrode 330 that is distal to the substrate 100). The gate insulating layer 220 may include a high dielectric material having a dielectric constant higher than that of a silicon oxide layer. In an implementation, the high dielectric material may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

A stacked structure 500 including an upper semiconductor layer (e.g., a channel layer) may be on the conductive pattern 400. In the stacked structure 500 including the upper semiconductor layer, the plurality of channel patterns 320_1, 320_2 and 320_3 and the gate electrode 330 surrounded by the gate insulating layer 220 may be alternately stacked.

In an implementation, the plurality of channel patterns 320_1, 320_2, and 320_3 may include, e.g., silicon (Si) or germanium (Ge), which is an elementary semiconductor material. In an implementation, the plurality of channel patterns 320_1, 320_2, and 320_3 may include a compound semiconductor, e.g., a group IV-IV compound semiconductor or a group III-V compound semiconductor.

For example, when the plurality of channel patterns 320_1, 320_2, and 320_3 include a group IV-IV compound semiconductor, the plurality of channel patterns 320_1, 320_2, and 320_3 may include a binary compound or a ternary compound including at least two elements of, e.g., carbon (C), silicon (Si), germanium (Ge) and tin (Sn), or the above-mentioned compound doped with a group IV element. For example, when the plurality of channel patterns 320_1, 320_2, and 320_3 include a III-V compound semiconductor, the plurality of channel patterns 320_1, 320_2, and 320_3 may include a binary compound, a ternary compound, or a quaternary compound formed by combining at least one of aluminum (Al), gallium (Ga) or indium (In) as a group III element with one of phosphorus (P), arsenic (As) and antimony (Sb) as a group V element.

The capping pattern 350 may be on the upper surfaces of the gate electrode 330 and the gate insulating layer 220. The capping pattern 350 may include an insulating material.

In an implementation, the capping pattern may be omitted.

The gate spacers 108 may be on both side surfaces of the gate insulating layer 220 and the capping pattern 350. For example, the gate insulating layer 220, the gate electrode 330, and the capping pattern 350 may fill a trench formed by the inner sidewalls of the gate spacers 108.

In an implementation, the gate spacer 108 may include, e.g., silicon nitride (SiN), silicon oxynitride (SiON), silicon oxide ($SiO_2$), silicon oxycarbonitride (SiOCN), or a combination thereof.

A source/drain region 700 may be connected to the stacked structure 500 including the lower semiconductor layer 200, the conductive pattern 400, and the upper semiconductor layer. In an implementation, the source/drain region 700 may have a maximum width in a first direction (X direction) smaller than a maximum width in a second direction (Y direction). The sidewalls of the source/drain region 700 may have a curved shape, and when the plurality of channel patterns 320_1, 320_2, and 320_3 are PMOS silicon channel patterns, channel mobility may be increased by applying stress to the plurality of channel patterns 320_1, 320_2, and 320_3.

A silicide layer 900 may be on the source/drain region 700, and a plurality of contacts 800 may be on the silicide layer 900.

The lower semiconductor layer 200 of the semiconductor device according to some embodiments may have a first thickness D1 (in the second direction Y), which may be smaller than a second thickness D2 and a third thickness D3, which will be described below. For example, it is possible to minimize the area where the semiconductor device (e.g., the lower semiconductor layer 200) meets the source/drain, thereby reducing the leakage current or leakage capacitance in an OFF state.

In an implementation, when fabricating the semiconductor device according to some embodiments, the lower semiconductor layer 200 may be formed to have the second thickness D2, which may be relatively thick (e.g., as compared with the first thickness D1). For example, when forming a recess for forming the source/drain region 700, it is possible to prevent the lowermost surface of the source/drain region 700 (in the −Y direction) from passing through the lower semiconductor layer 200 and reaching the buried insulating layer 110, and it is also possible to prevent an unetch phenomenon in which the source/drain region 700 is formed so as not to reach the lower semiconductor layer 200.

FIGS. 2 to 9 illustrate schematic sectional view of stages in a method of fabricating the semiconductor device of FIG. 1 according to some embodiments. In the following description, a redundant description may be omitted.

Figure 2:
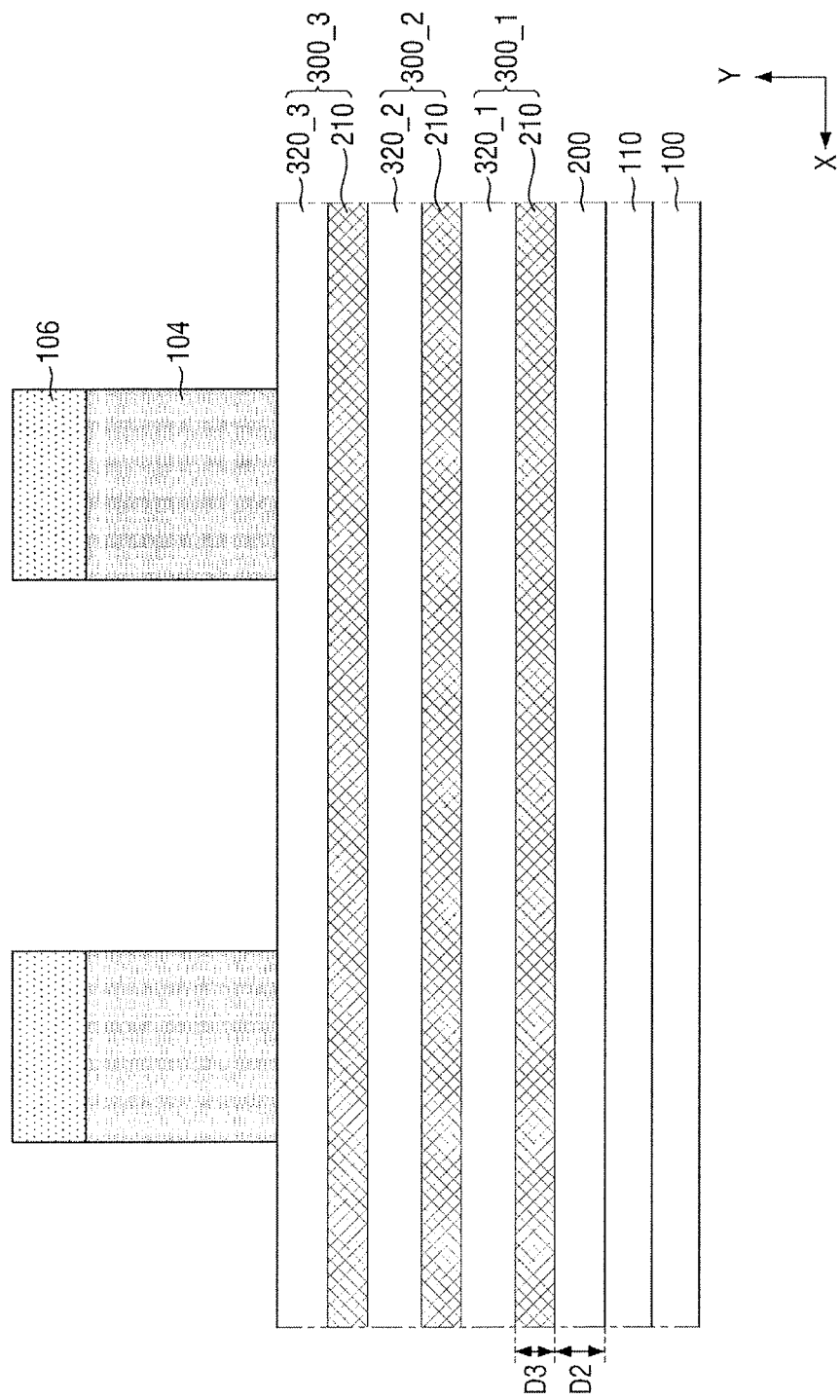
FIGS. 2 to 9 illustrate schematic sectional views of stages in a method of fabricating the semiconductor device of FIG. 1 according to some embodiments.

Referring to FIG. 2, the lower semiconductor layer 200 may be formed on the buried insulating layer 110 on the substrate 100. A first preliminary stacked structure 300_1 (in which a sacrificial layer 210 and the first channel pattern 320_1 are sequentially stacked) may be formed on the lower semiconductor layer 200. A second preliminary stacked structure 300_2 (in which the sacrificial layer 210 and the second channel pattern 320_2 are sequentially stacked) may be formed on the first preliminary stacked structure 300_1. A third preliminary stacked structure 300_3 (in which the sacrificial layer 210 and the third channel pattern 320_3 are sequentially stacked) may be formed on the second preliminary stacked structure 300_2. In an implementation, each of the preliminary stacked structures 300_1, 300_2 and 300_3 may further include the sacrificial layer 210 and channel patterns.

Each of the sacrificial layers 210 may include the same material. The sacrificial layer 210 and the plurality of channel patterns 320_1, 320_2, and 320_3 may include different materials. In an implementation, each sacrificial layer 210 may have a third thickness D3 in the Y direction, which is the thickness direction of the substrate. In an implementation, each sacrificial layer 210 may have a different thickness. A case where each sacrificial layer 210 has the same third thickness D3 will be described below.

In an implementation, each sacrificial layer 210 may include silicon germanium. In addition, the plurality of channel patterns 320_1, 320_2, and 320_3 may include a material having an etch selectivity with respect to the sacrificial layer 210.

In an implementation, the plurality of channel patterns 320_1, 320_2, and 320_3 may include a material that may be used as a channel region of a transistor. For example, in the case of PMOS, the plurality of channel patterns 320_1, 320_2 and 320_3 may include a material having high hole mobility, and in the case of NMOS, the plurality of channel patterns 320_1, 320_2 and 320_3 may include a material having high electron mobility. Hereinafter, it is described that the plurality of channel patterns 320_1, 320_2, and 320_3 include silicon.

When each of the plurality of channel patterns 320_1, 320_2, and 320_3 includes silicon, they may be described as a plurality of silicon channel patterns.

The lower semiconductor layer 200 on the buried insulating layer 110 may have the second thickness D2 in the Y direction, which is the thickness direction of the substrate 100. The second thickness D2 may be greater than the first thickness D1 of FIG. 1 (e.g., the thickness of the lower semiconductor layer 200 in the Y direction in the finally-prepared device). In an implementation, the second thickness D2 may be greater than the third thickness D3. In an implementation, the second thickness D2 may be equal to the third thickness D3.

In an implementation, the buried insulating layer 110 may include, e.g., silicon oxide ($SiO_2$), silicon nitride (SiN), silicon oxynitride (SiON) or a combination thereof.

The lower semiconductor layer 200 may include silicon germanium in the same manner as the sacrificial layer 210. For example, in a process of fabricating a semiconductor device according to some embodiments, the second thickness D2 of the lower semiconductor layer 200 may be adjusted to help prevent an unetch phenomenon from occurring when forming a source/drain recess.

In an implementation, the lower semiconductor layer 200 may include silicon germanium in the same manner as the sacrificial layer 210, and when removing the sacrificial layer 210 to be described below, the lower semiconductor layer 200 may also be removed, so that the semiconductor device according to some embodiments may be formed to have the first thickness D1 smaller than the initial second thickness D2.

For example, the first thickness D1 of the lower semiconductor layer 200 of the semiconductor device according to some embodiments may be smaller than the second thickness D2 (e.g., the intermediate thickness) during the process of fabricating a semiconductor device according to some embodiments, thereby reducing an influence of the leakage current or leakage capacitance in an OFF state.

A first proportion or concentration of germanium in the silicon germanium of the lower semiconductor layer 200 may be smaller than a second proportion or concentration of germanium in the silicon germanium of the sacrificial layer 210. In the process of removing the sacrificial layer 210, the removal rate may vary depending on the proportion of germanium in the silicon germanium. For example, the smaller the proportion of germanium in the silicon germanium, the faster the removal rate. For example, if the proportion of germanium in the lower semiconductor layer 200 is smaller than the proportion, of germanium in the sacrificial layer 210, the lower semiconductor layer 200 may be removed faster than the sacrificial layer 210 in the process of removing the sacrificial layer 210, which will be described below.

For example, by decreasing the proportion of germanium in the lower semiconductor layer 200, it is possible to further increase the second thickness D2 of the lower semiconductor layer 200. For example, it is possible to suppress an unetch phenomenon occurring during the process of fabricating a semiconductor device according to some embodiments, and also possible to more quickly remove the lower semiconductor layer 200 during the removal of the sacrificial layer 210. For example, it is possible to reduce the first thickness D1 of the lower semiconductor layer 200 of the semiconductor device according to some embodiments, thereby suppressing the leakage current or leakage capacitance in an OFF state of the semiconductor device according to some embodiments.

By using a mask pattern on the third preliminary stacked structure 300_3, a sacrificial gate 104 and a mask pattern 106 on the sacrificial gate 104 may be formed. The sacrificial gate 104 may include, e.g., polysilicon or amorphous silicon.

Figure 3:
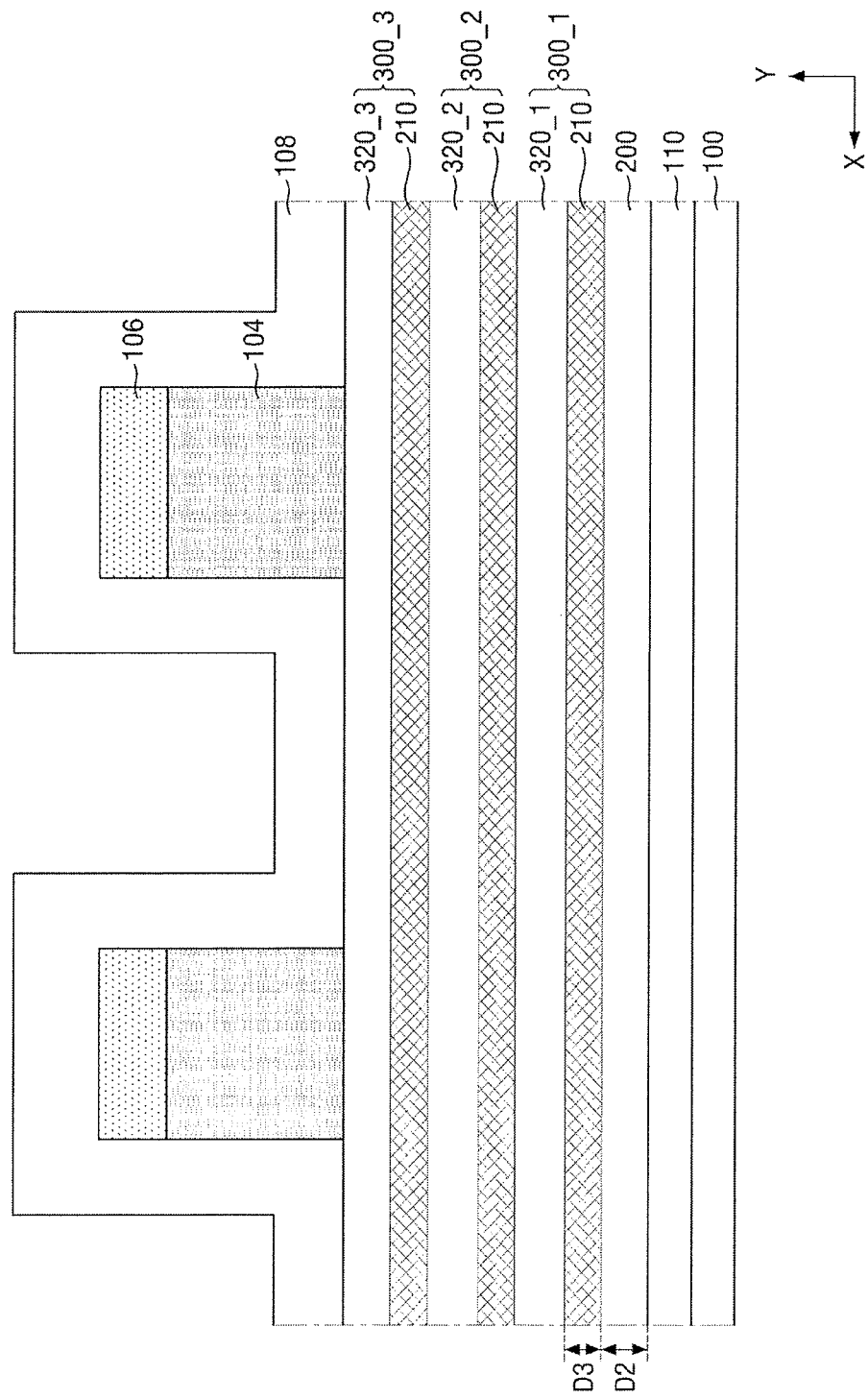

Then, referring to FIG. 3, a gate spacer 108 may be conformally formed to cover the upper surface of the third preliminary stacked structure 300_3, the side surface of the sacrificial gate 104, and the mask pattern 106.

In an implementation, the gate spacer 108 may include, e.g., silicon nitride (SiN), silicon oxynitride (SiON), silicon oxide ($SiO_2$), silicon oxycarbonitride (SiOCN), or a combination thereof.

Figure 4:
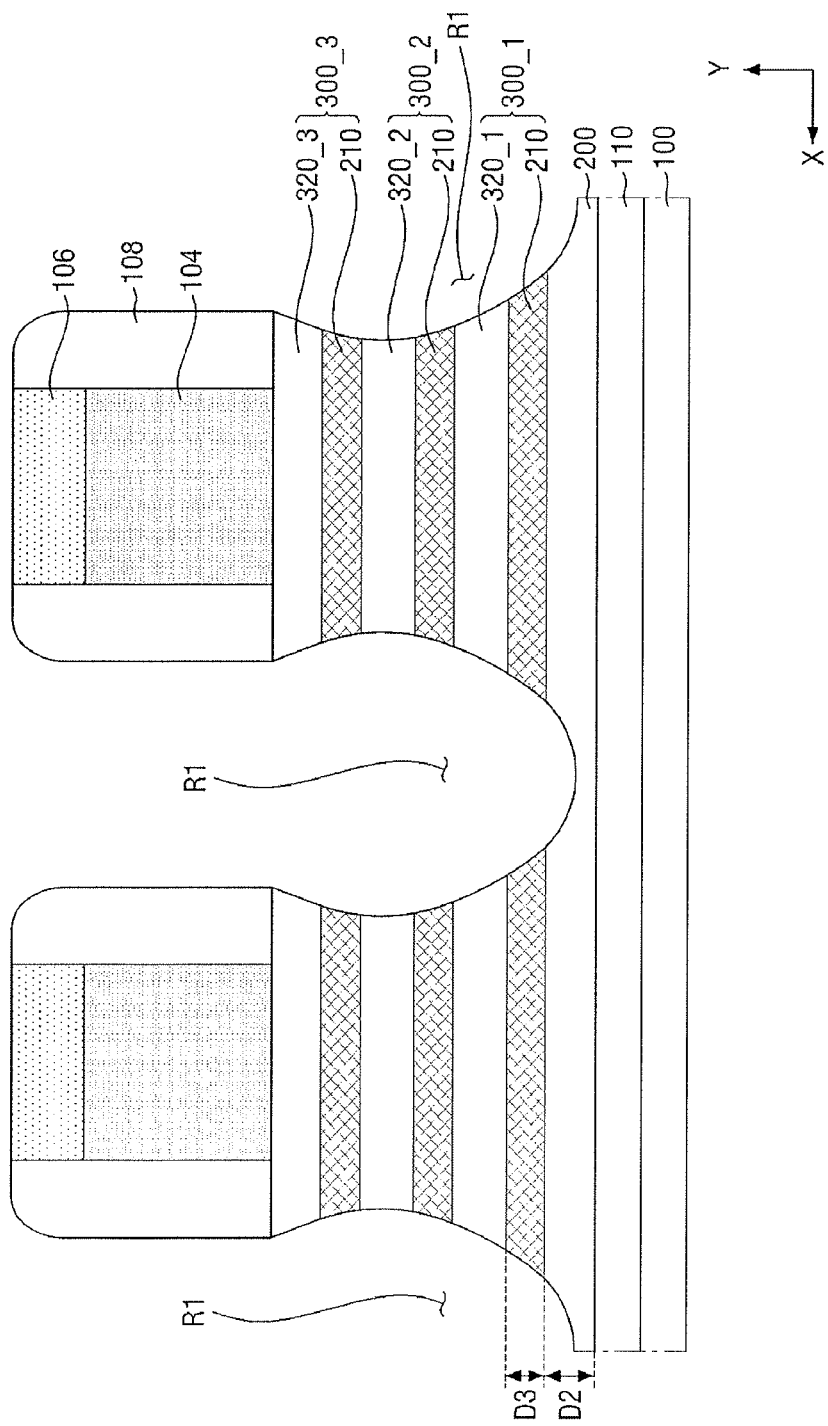

Then, referring to FIG. 4, the gate spacer 108 may be etched to form a source/drain recess R1 exposing at least a portion of the lower semiconductor layer 200.

In the method of fabricating a semiconductor device according to some embodiments, the second thickness D2 of the lower semiconductor layer 200 may be selected such that an unetch phenomenon does not occur when the source/drain recess R1 is formed.

For example, the lower semiconductor layer 200 having the second thickness D2, which is sufficiently thick, may help prevent the lowermost surface of the source/drain recess R1 in the −Y direction from passing through the lower semiconductor layer 200 and reaching the buried insulating layer 110. It is also possible to prevent an unetch phenomenon in which the lower semiconductor layer 200 is not etched at all.

The side surface of the source/drain recess R1 may have a curved shape, which may increase stress when the plurality of channel patterns 320_1, 320_2, and 320_3 are P-type silicon patterns, thereby further increasing mobility of charges in the channel.

In the method of fabricating a semiconductor device according to some embodiments, the shape of the side surface of the source/drain recess R1 may have a shape other than the curved shape. In an implementation, the lowermost surface of the source/drain recess R1 may be at a suitable position within the lower semiconductor layer 200.

Figure 5:
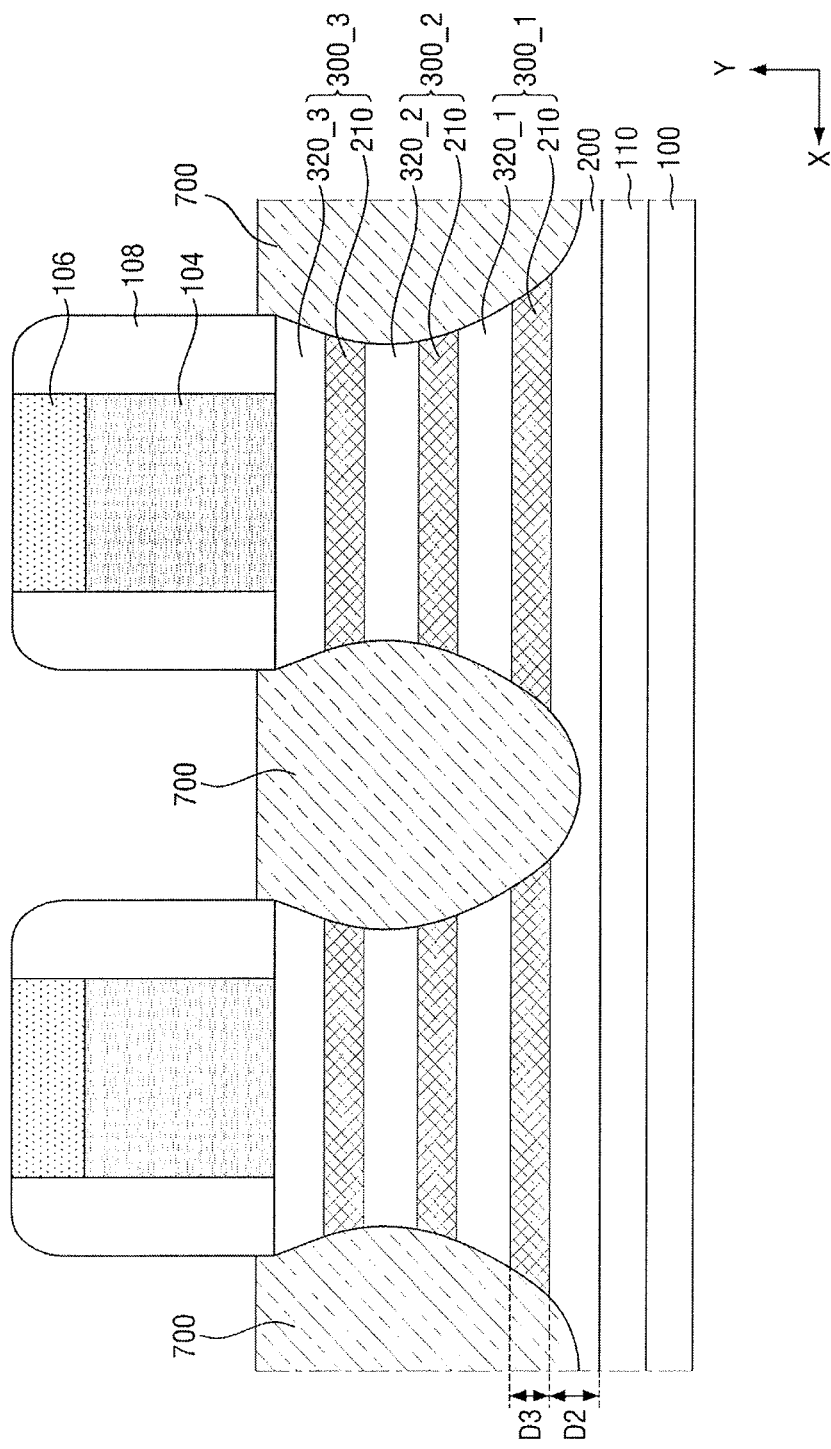

Subsequently, referring to FIG. 5, a source/drain region 700 may be formed in the source/drain recess R1 through an epitaxial process. The uppermost surface of the source/drain region 700 (e.g., distal to the substrate 100) may be higher (e.g., farther from the substrate in the Y direction) than the uppermost surface of the third channel pattern 320_3 of the third preliminary stacked structure 300_3 in the Y direction.

Figure 6:
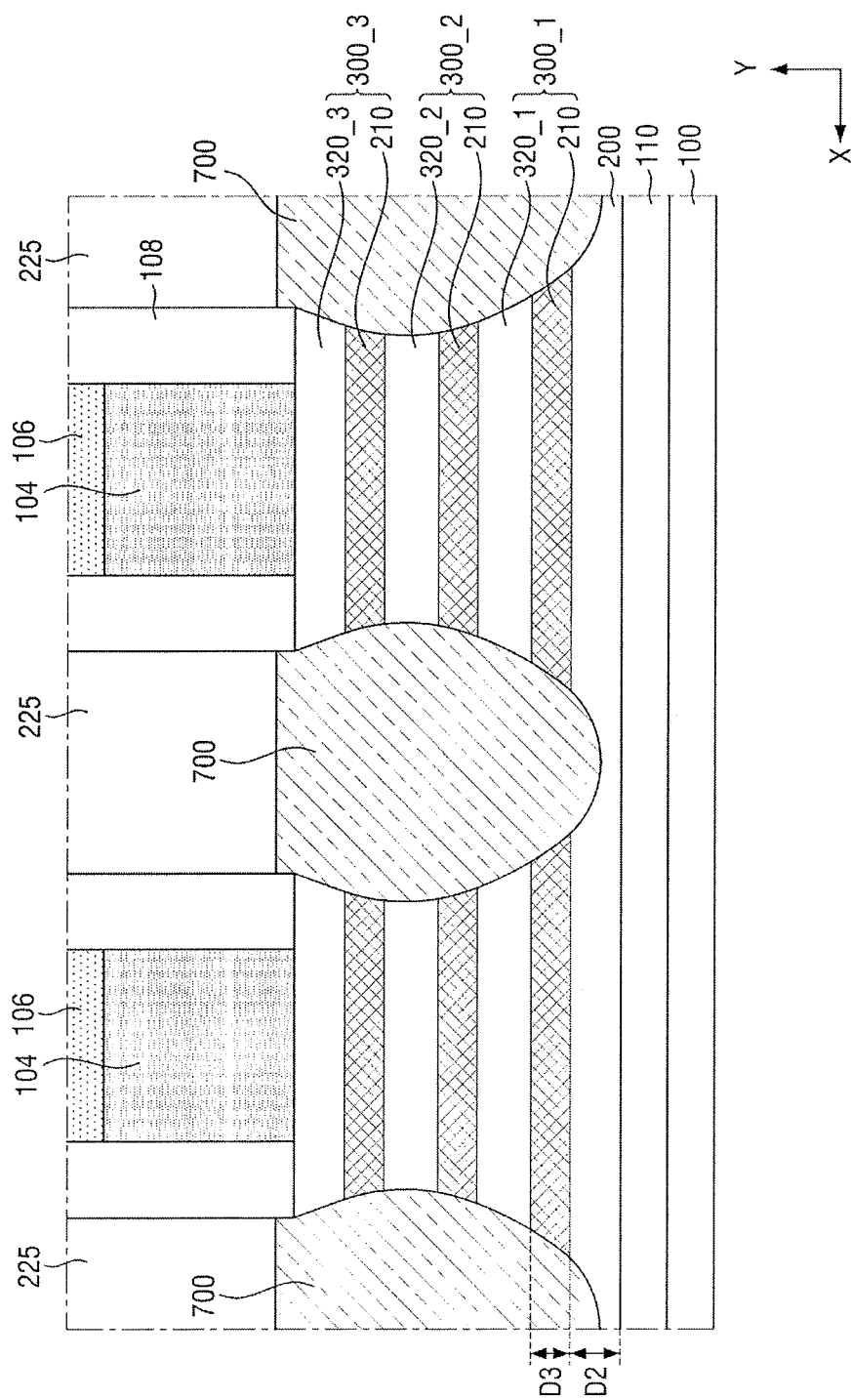

Subsequently, referring to FIG. 6, an interlayer insulating layer 225 may be formed to cover the source/drain region 700, the gate spacer 108, and the mask pattern 106. FIG. 6 shows a state after planarizing the upper surfaces of the interlayer insulating layer 225, the gate spacer 108 and the mask pattern 106 through a Chemical Mechanical Polishing (CMP) process after the formation of the interlayer insulating layer 225.

The interlayer insulating layer 225 may include, e.g., silicon oxide, silicon nitride, silicon oxynitride, or a low dielectric constant material having a lower dielectric constant than silicon oxide. In an implementation, the low dielectric constant material may include, e.g., flowable oxide (FOX), Tonen Silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SILK, polyimide, a porous polymeric material, or a combination thereof.

Figure 7:
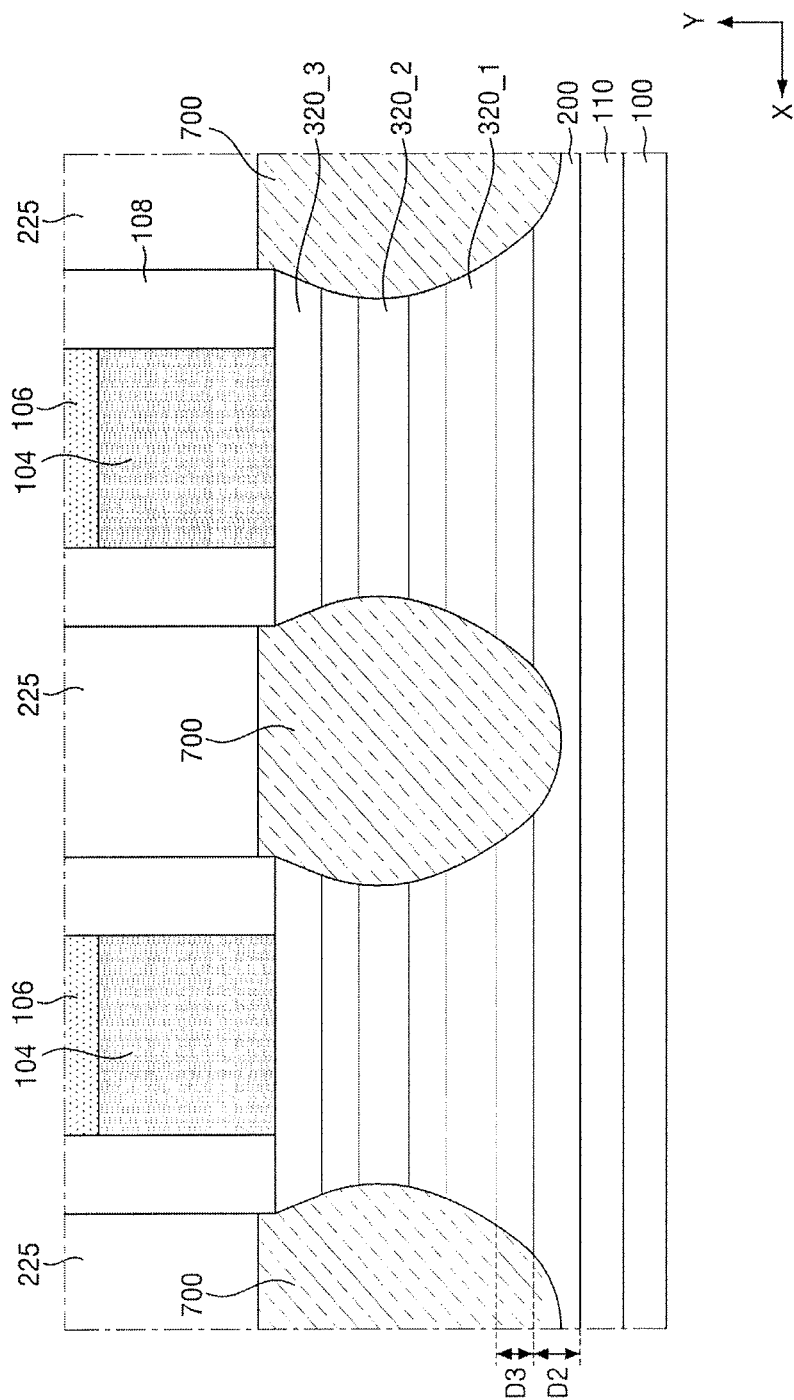

Subsequently, referring to FIG. 7, the sacrificial layer 210 may be removed. For reference, in FIG. 7, the second thickness D2 of the lower semiconductor layer 200 is maintained for convenience of description in the method of fabricating a semiconductor device according to some embodiments.

In the method of fabricating a semiconductor device according to some embodiments, the proportion of germanium in the lower semiconductor layer 200 may be smaller than the proportion of germanium in the sacrificial layer 210, and when the sacrificial layer 210 is removed, the lower semiconductor layer 200 may be removed more quickly. For example, the thickness of the lower semiconductor layer 200 may be reduced from the (intermediate) second thickness D2 to the (final) first thickness D1 of FIG. 8.

The thickness of the lower semiconductor layer 200 and the proportion of germanium may be adjusted or selected according to the semiconductor device according to some embodiments. For example, in order to form the lower semiconductor layer 200 having a thick thickness in a process of fabricating a semiconductor device according to some embodiments and form the lower semiconductor layer 200 having a very thin first thickness D1 in the semiconductor device according to some embodiments formed according to the fabricating method, the semiconductor device according to some embodiments may be fabricated by decreasing the proportion of germanium in the lower semiconductor layer 200 such that the second thickness D2 of the lower semiconductor layer 200 formed at the initial step of the method of fabricating a semiconductor device according to some embodiments becomes thicker.

Figure 8:
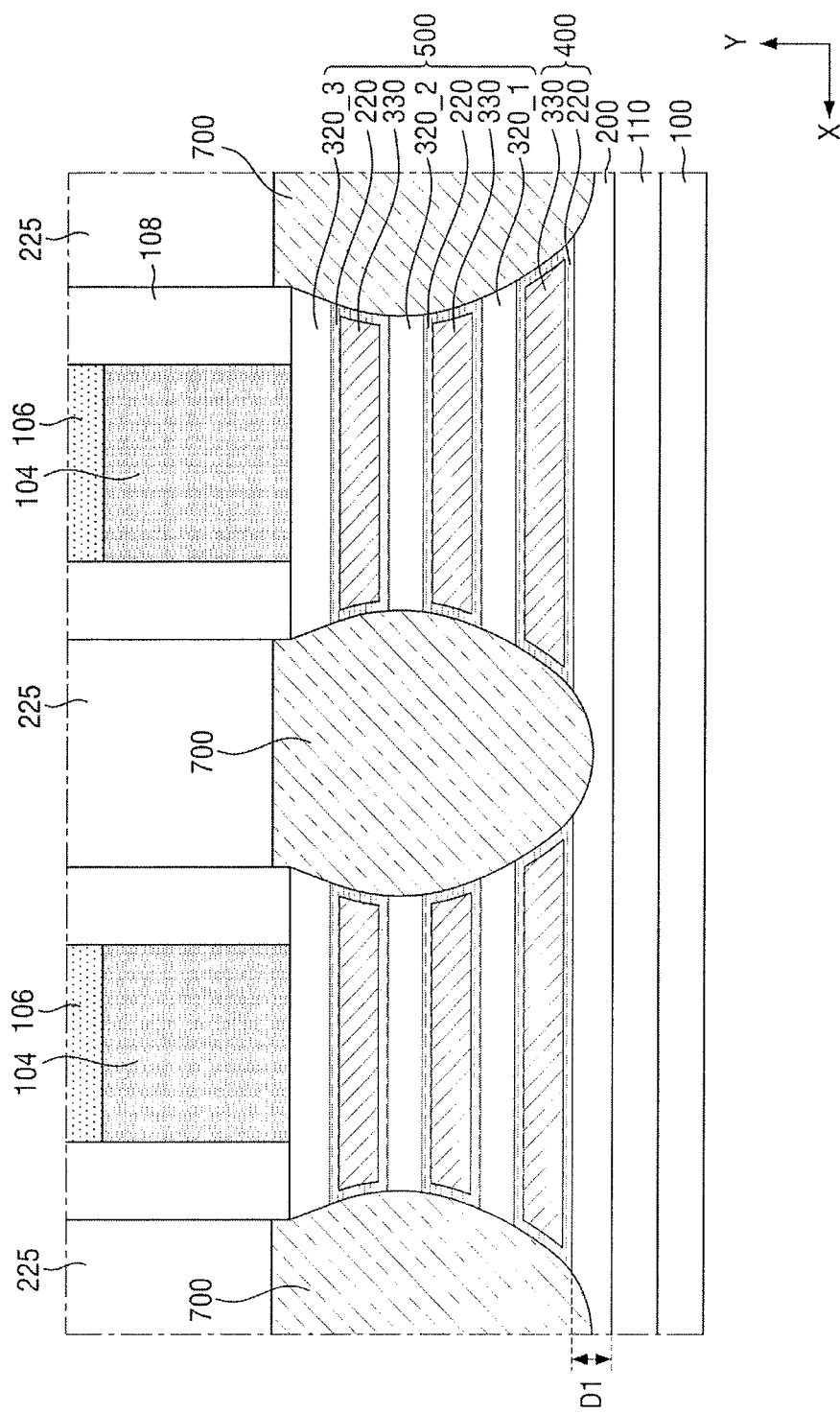

Subsequently, referring to FIG. 8, at a position where the sacrificial layer has been removed, the gate insulating layer 220 may be formed along the sidewall of a space where the sacrificial layer has been removed. Then, by filling a conductive material in the gate insulating layer 220, the gate electrode 330 may be formed.

In the semiconductor device according to the method of fabricating a semiconductor device according to some embodiments, the lower semiconductor layer 200 may be removed at a high rate during the removal of the sacrificial layer, and thus may have the first thickness D1 smaller than the second thickness D2.

Subsequently, referring to FIG. 9, after the sacrificial gate 104 and the mask pattern 106 are removed, another gate insulating layer 220 may be formed along the sidewall of the trench formed in the gate spacer 108. Then, another gate electrode 330 may be formed by filling a conductive material in the gate insulating layer 220. A capping pattern 350 may be formed on the upper surface of the gate electrode 330 and the gate insulating layer 220.

Figure 9:
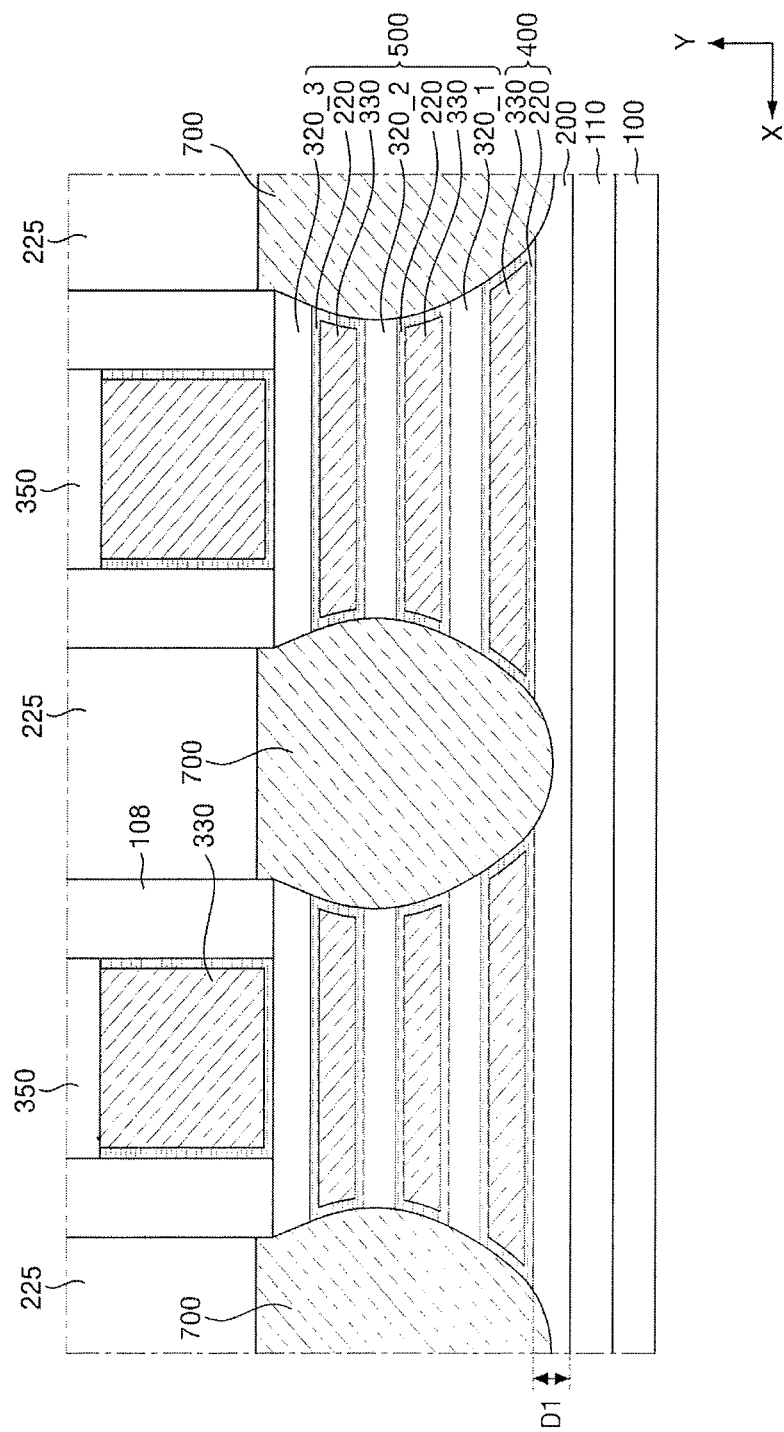

Referring again to FIG. 1, after the process of FIG. 9, by removing the interlayer insulating layer 225, the silicide layer 900 may be formed on the source/drain region 700, and a plurality of contacts 800 may be formed on the silicide layer 900. For example, the plurality of contacts 800 may transmit an electrical signal to the source/drain region 700.

Figure 10:
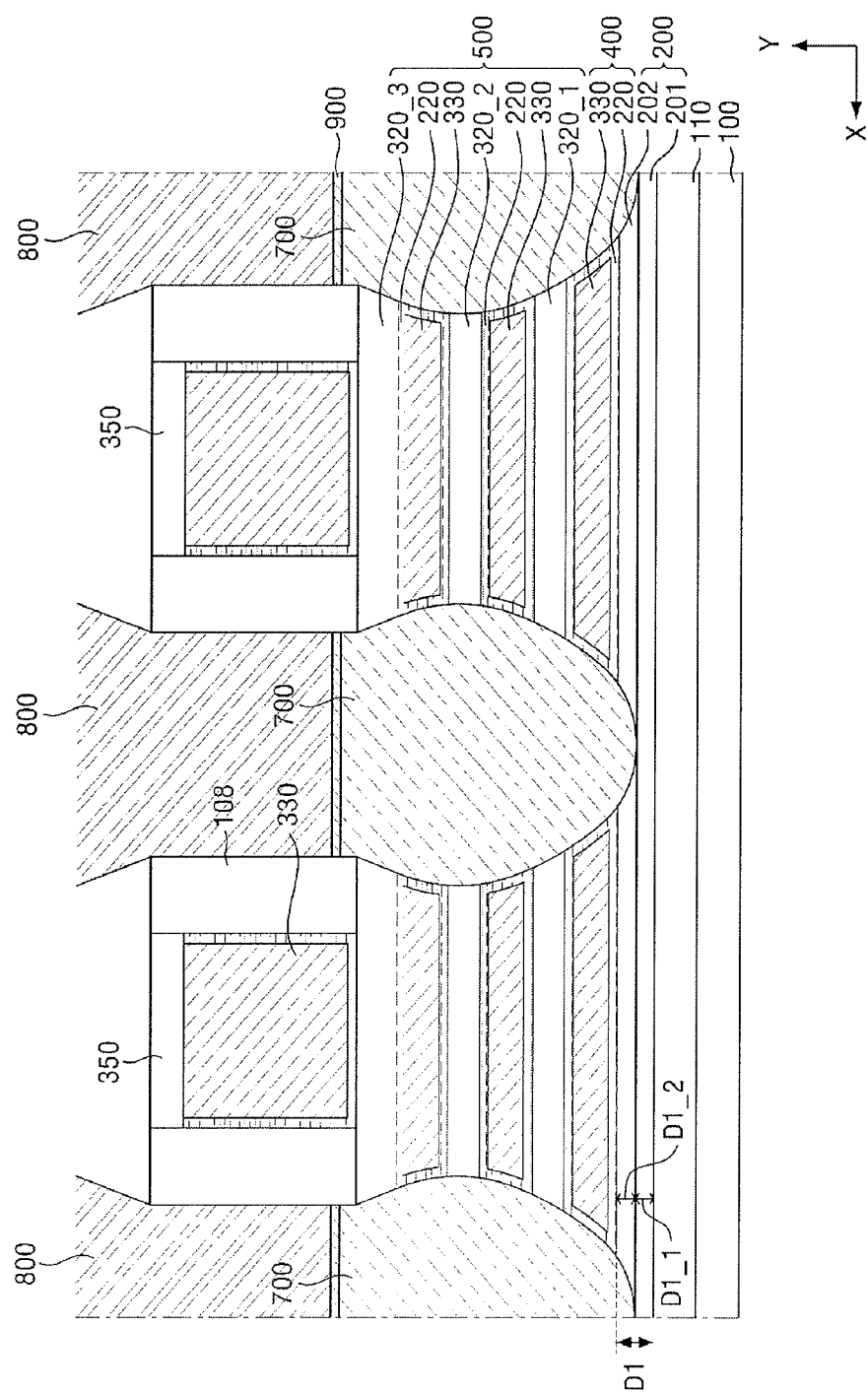
FIG. 10 illustrates a schematic sectional view of a semiconductor device according to some embodiments.

FIG. 10 illustrates a schematic sectional view of a semiconductor device according to some embodiments. In the following description, a redundant description may be omitted.

Referring to FIG. 10, the lower semiconductor layer 200 may include a first sub-semiconductor layer 201 and a second sub-semiconductor layer 202. The first sub-semiconductor layer 201 may have a first_first thickness D1_1, and the second sub-semiconductor layer 202 may have a first_second thickness D1_2. In an implementation, the first_first thickness D1_1 and the first_second thickness D1_2 may be different thicknesses.

In the semiconductor device according to some embodiments, the first sub-semiconductor layer 201 of the lower semiconductor layer 200 may include silicon, and the second sub-semiconductor layer 202 of the lower semiconductor layer 200 may include silicon germanium.

For example, the first thickness of the lower semiconductor layer 200 may be adjusted by adjusting the first_first thickness D1_1 and the first_second thickness D1_2 of the first sub-semiconductor layer 201 and the second sub-semiconductor layer 202, respectively. For example, by adjusting the proportion of germanium included in the second sub-semiconductor layer 202, when the sacrificial layer is removed, the rate at which the second sub-semiconductor layer 202 of the lower semiconductor layer 200 is removed may be adjusted.

The method of fabricating the semiconductor device of FIG. 10 according to some embodiments is similar except that the lower semiconductor layer 200 of FIG. 2 includes the first sub-semiconductor layer 201 and the second sub-semiconductor layer 202, and a repeated description thereof is omitted.

Figure 11:
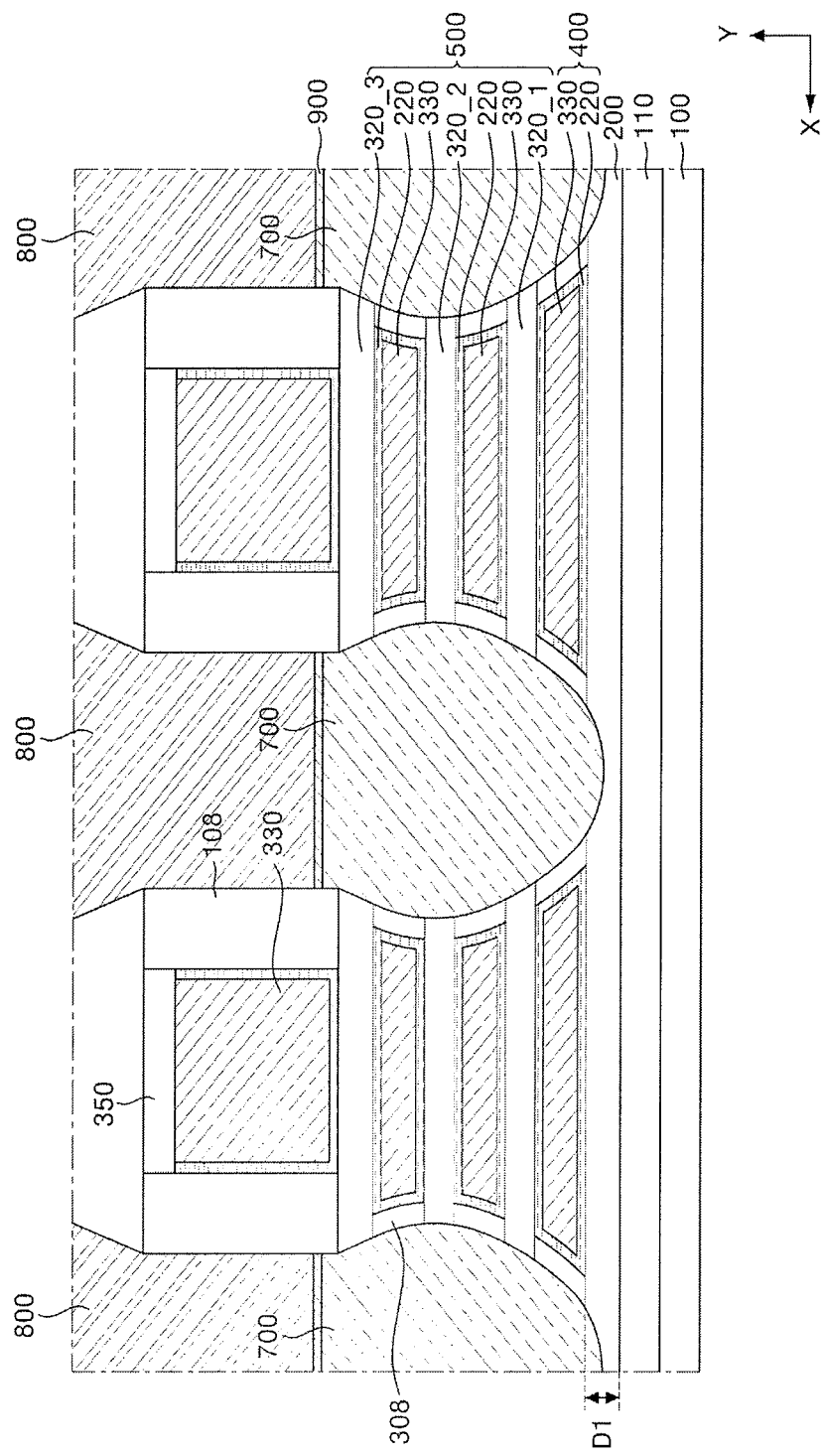
FIG. 11 illustrates a schematic sectional view of a semiconductor device according to some embodiments.

FIG. 11 illustrates a schematic sectional view of a semiconductor device according to some embodiments.

Unlike the semiconductor device of FIG. 1 according to some embodiments, the semiconductor device of FIG. 11 may further include an inner spacer 308 between the gate insulating layer 220 and the source/drain region 700. For example, the inner spacer 308 may be on the side surface of the gate insulating layer 220 surrounding the gate electrode 330 between the source/drain regions 700.

The inner spacer 308 may include, e.g., a low dielectric constant material, silicon nitride (SiN), silicon oxynitride (SiON), silicon oxide (SiO$_2$), silicon oxycarbonitride (SiOCN), or a combination thereof. The low dielectric constant material may be a material having a lower dielectric constant than silicon oxide.

Figure 12:
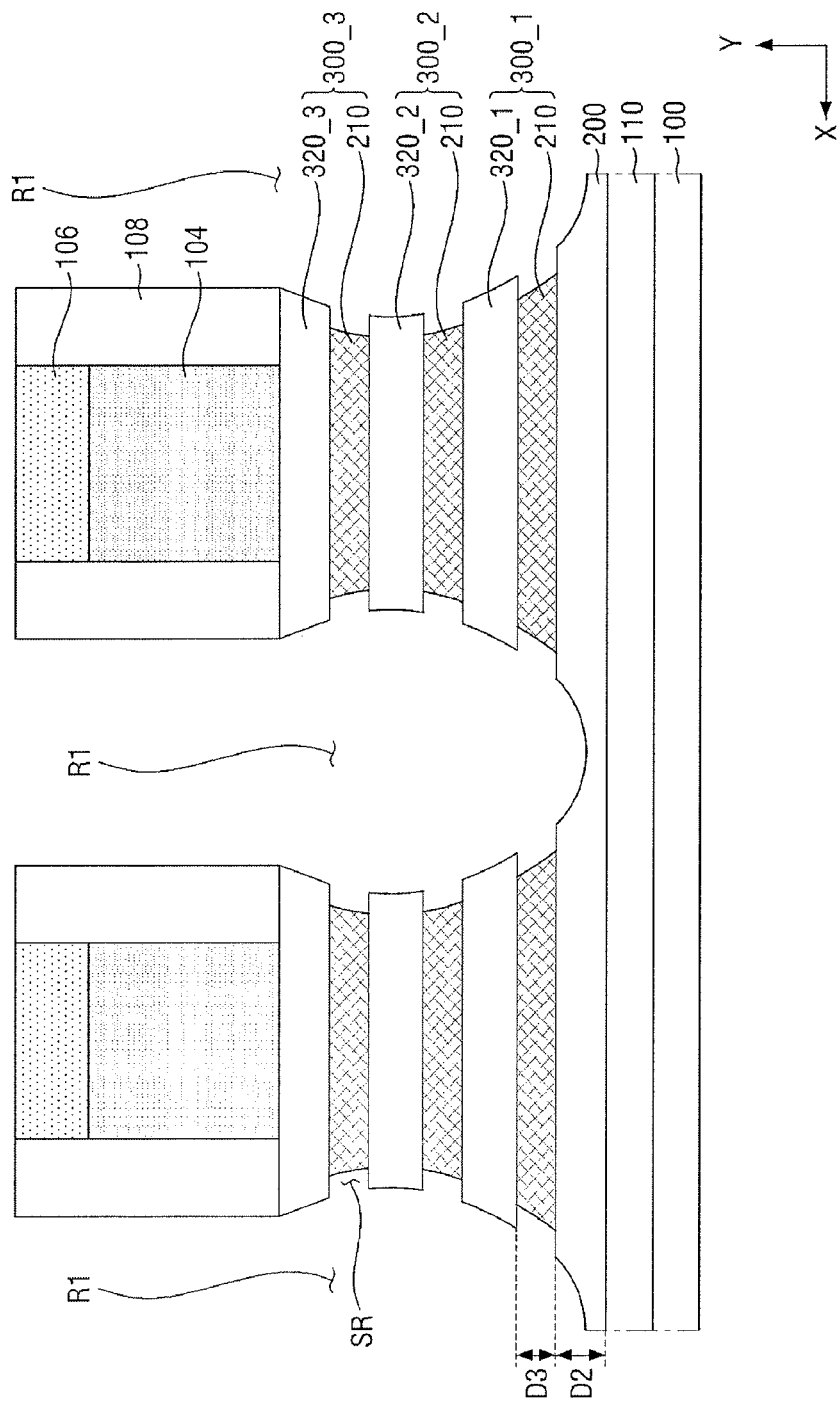
FIGS. 12 and 13 illustrate schematic sectional views of stages in a method of fabricating the semiconductor device of FIG. 11 according to some embodiments.
Figure 13:
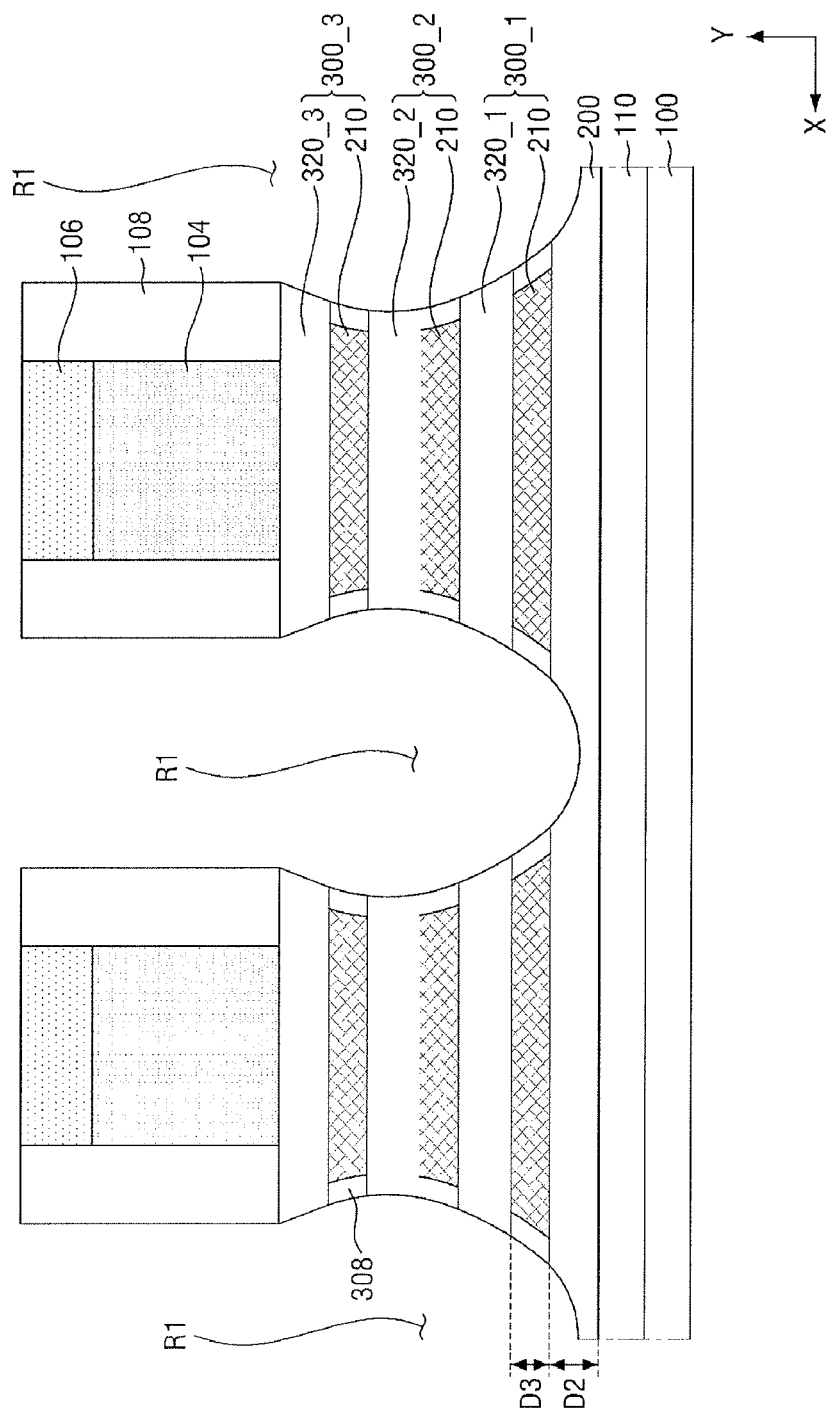

FIGS. 12 and 13 illustrate schematic sectional views of stages in a method of fabricating the semiconductor device of FIG. 11 according to some embodiments.

Some of the intermediate steps of the method of fabricating the semiconductor device of FIG. 11 according to some embodiments are the same as those of FIGS. 2 to 4, and the steps following the step of FIG. 4 will be described.

Referring to FIG. 12, a portion of the sacrificial layer 210 exposed by the source/drain recess R1 may be etched. For example, the sacrificial layer 210 may be etched through a selective etching process.

Through the etching process of the sacrificial layer 210, an inner spacer recess SR may be formed such that the sidewall of the sacrificial layer 210 is more recessed (e.g., in the X direction) than the sidewall of each of the plurality of channel patterns 320_1, 320_2, and 320_3 exposed by the source/drain recess R1.

Subsequently, referring to FIG. 13, an inner spacer 308 may be formed along the sidewall of the region exposed by the source/drain recess R1. Then, the remaining portions (except the inner spacer 308 formed between the plurality of channel patterns 320_1, 320_2, and 320_3) may be removed.

Subsequent steps are the same as those of FIGS. 5 to 9 and the process of forming the semiconductor device of FIG. 11 after the step of FIG. 9 is also similar, and a description thereof is omitted.

Figure 14:
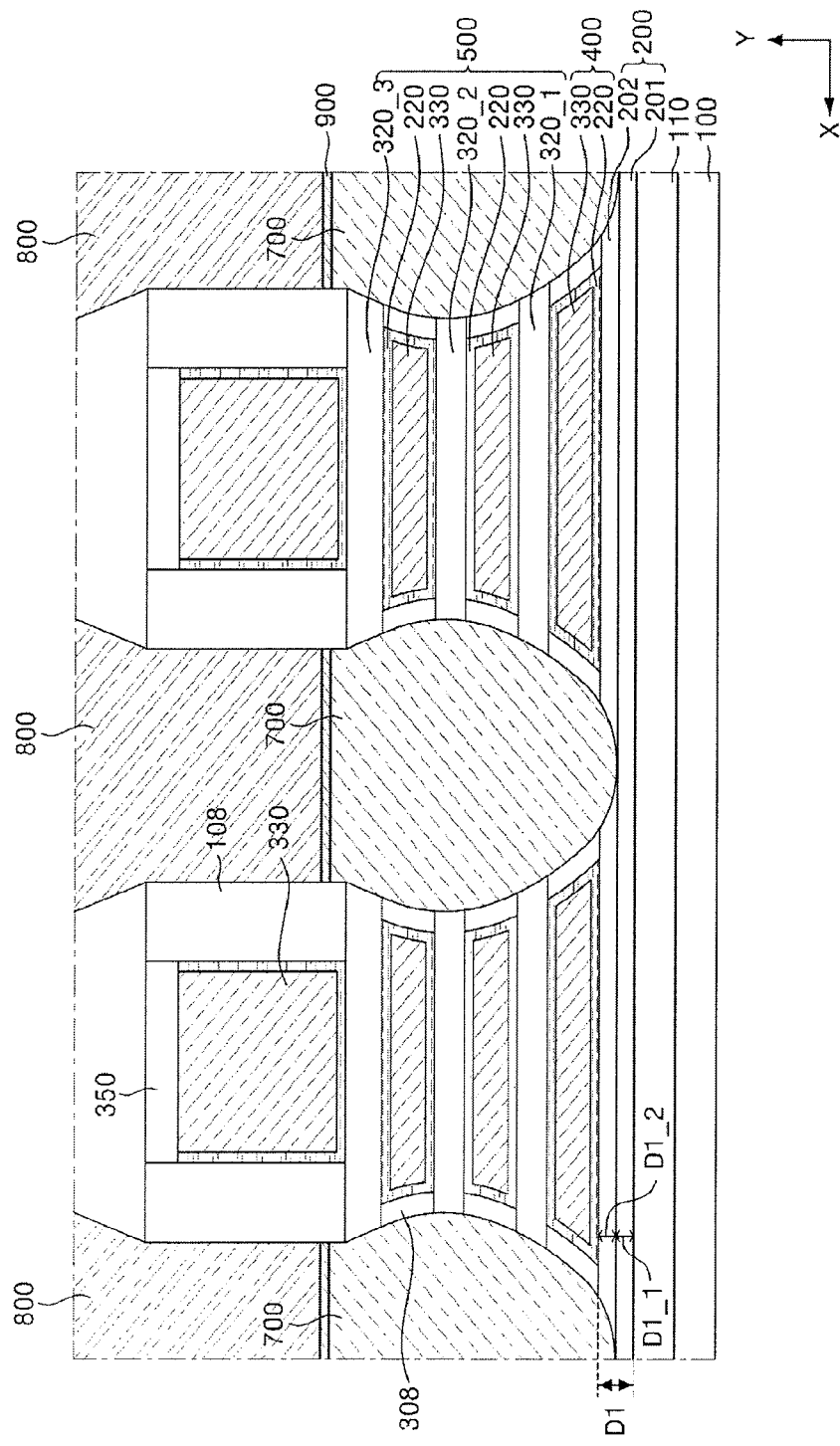
FIG. 14 illustrates a schematic sectional view of a semiconductor device according to some embodiments.

FIG. 14 illustrates a schematic sectional view of a semiconductor device according to some embodiments.

Referring to FIG. 14, unlike the semiconductor device of FIG. 1, the lower semiconductor layer 200 may include a first sub-semiconductor layer 201 and a second sub-semiconductor layer 202 and the semiconductor device may include an inner spacer 308. The feature that the lower semiconductor layer 200 includes the first sub-semiconductor layer 201 and the second sub-semiconductor layer 202 is similar to the feature of the semiconductor device of FIG. 10. The feature of including the inner spacer 308 is similar to the feature of the semiconductor device of FIG. 11, and a description thereof is omitted.

By way of summation and review, semiconductor devices have become smaller and higher in performance. For example, a small structural difference in transistors included in the semiconductor device may have a large influence on the performance of the semiconductor device. In order to meet performance requirements, a silicon-on-insulator (501) substrate may be used.

In order to form a transistor structure on an SOI substrate, a silicon (Si) layer may be formed on a buried insulating layer forming the SOI substrate. If the thickness of the silicon layer on the buried insulating layer were to be too thin, an unetch phenomenon could occur due to a lack of margin when forming a source/drain recess in a process of fabricating a semiconductor device. If the thickness of the silicon layer on the buried insulating layer were to be too thick, the leakage current of the semiconductor device could increase.

One or more embodiments may include forming a silicon germanium (SiGe) layer, instead of a silicon layer, on the buried insulating layer to increase the margin by forming a thick silicon germanium layer during a process of fabricating a semiconductor device and reducing the leakage current of the semiconductor device by maintaining a thin thickness of the silicon germanium layer after fabrication of the semiconductor device.

One or more embodiments may provide a semiconductor device with improved product reliability.

One or more embodiments may provide a method for fabricating a semiconductor device with improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a buried insulating layer on a substrate;
   a lower semiconductor layer on the buried insulating layer, the lower semiconductor layer including a first material;
   a channel pattern on the lower semiconductor layer, the channel pattern being spaced apart from the lower semiconductor layer and including a second material different from the first material;
   a gate electrode surrounding at least a portion of the channel pattern; and
   a source/drain region on the lower semiconductor layer, the source/drain region being connected to the channel pattern,
   wherein the first material includes silicon germanium,
   wherein the lower semiconductor layer includes a source/drain recess,
   wherein a portion of the source/drain region fills the source/drain recess.

2. The semiconductor device as claimed in claim 1, wherein:
   the first material includes silicon germanium (SiGe), and
   a thickness of the lower semiconductor layer is smaller than a thickness of the channel pattern when measured in a same direction.

3. The semiconductor device as claimed in claim 2, wherein the lower semiconductor layer includes a first sub-semiconductor layer and a second sub-semiconductor layer on the first sub-semiconductor layer.

4. The semiconductor device as claimed in claim 3, wherein:
   the first sub-semiconductor layer includes silicon, and
   the second sub-semiconductor layer includes silicon germanium.

5. The semiconductor device as claimed in claim 1, wherein a side surface of the source/drain region has a curved shape.

6. The semiconductor device as claimed in claim 1, further comprising an inner spacer on a sidewall of the gate electrode.

7. A semiconductor device, comprising:
a lower semiconductor layer on a substrate, the lower semiconductor layer including a first material;
a stacked structure on the lower semiconductor layer, the stacked structure including a conductive pattern and an upper semiconductor layer on the conductive pattern, and the upper semiconductor layer including a second material different from the first material; and
a source/drain region directly contacting the lower semiconductor layer, the source/drain region being connected to the upper semiconductor layer.

8. The semiconductor device as claimed in claim 7, wherein the conductive pattern includes a gate electrode surrounding at least a portion of the upper semiconductor layer.

9. The semiconductor device as claimed in claim 7, further comprising a buried insulating layer on the substrate, wherein:
the first material includes silicon germanium, and
the second material includes silicon.

10. The semiconductor device as claimed in claim 7, wherein the lower semiconductor layer includes a first sub-semiconductor layer and a second sub-semiconductor layer on the first sub-semiconductor layer.

11. The semiconductor device as claimed in claim 10, wherein:
the first sub-semiconductor layer includes silicon, and
the second sub-semiconductor layer includes silicon germanium.

12. The semiconductor device as claimed in claim 11, wherein a side surface of the source/drain region has a curved shape.

13. The semiconductor device as claimed in claim 7, further comprising an inner spacer on a sidewall of the stacked structure.

14. A semiconductor device, comprising:
a silicon substrate;
a buried insulating layer on the silicon substrate, the buried insulating layer including an oxide;
a lower semiconductor layer on the buried insulating layer, the lower semiconductor layer including a recess;
a first silicon channel pattern spaced apart from the lower semiconductor layer;
a second silicon channel pattern on the first silicon channel pattern;
a gate electrode on the lower semiconductor layer, the gate electrode surrounding at least a portion of the first silicon channel pattern and the second silicon channel pattern; and
a source/drain region connected to the first silicon channel pattern and the second silicon channel pattern and filling at least a portion of the recess,
wherein:
the lower semiconductor layer includes a material different from materials of the first silicon channel pattern and the second silicon channel pattern,
the lower semiconductor layer includes a first sub-semiconductor layer and a second sub-semiconductor layer on the first sub-semiconductor layer,
the first sub-semiconductor layer includes silicon,
the second sub-semiconductor layer includes silicon germanium.

15. The semiconductor device as claimed in claim 14, wherein:
the lower semiconductor layer includes silicon germanium, and
a thickness of the lower semiconductor layer is smaller than thicknesses of the first silicon channel pattern and the second silicon channel pattern when measured in a same direction.

16. The semiconductor device as claimed in claim 14, further comprising an inner spacer on the gate electrode.

* * * * *